(12) United States Patent
Lin et al.

(10) Patent No.: US 10,361,151 B2
(45) Date of Patent: Jul. 23, 2019

(54) WIRING BOARD HAVING ISOLATOR AND BRIDGING ELEMENT AND METHOD OF MAKING WIRING BOARD

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 183 days.

(21) Appl. No.: 15/369,896

(22) Filed: Dec. 6, 2016

(65) Prior Publication Data

US 2017/0084530 A1    Mar. 23, 2017

Related U.S. Application Data

(63) Continuation-in-part of application No. 14/621,332, filed on Feb. 12, 2015, and a continuation-in-part of (Continued)

(51) Int. Cl.
*H01L 23/498* (2006.01)
*H01L 23/00* (2006.01)

(Continued)

(52) U.S. Cl.
CPC .... *H01L 23/49838* (2013.01); *H01L 21/4853* (2013.01); *H01L 23/3675* (2013.01); *H01L 23/49811* (2013.01); *H01L 23/49894* (2013.01); *H01L 23/564* (2013.01); *H05K 1/0204* (2013.01); *H05K 1/142* (2013.01); *H01L 25/0753* (2013.01); *H01L 33/64* (2013.01); *H01L 2224/18* (2013.01); *H05K 3/4694* (2013.01); *H05K 2201/0187* (2013.01); *H05K 2201/1028* (2013.01); *H05K 2201/10106* (2013.01); *H05K 2201/10636* (2013.01);

(Continued)

(58) Field of Classification Search
CPC .......... H01L 21/4853; H01L 23/49838; H01L 23/3675; H01L 23/49811; H01L 23/49894; H01L 23/564; H05K 1/0204; H05K 1/142
USPC ....................................................... 156/150
See application file for complete search history.

(56) References Cited

U.S. PATENT DOCUMENTS 6,303,977 B1 * 10/2001 Schroen ............. H01L 23/3185
                                                                 257/620
7,670,872 B2    3/2010 Yan
(Continued)

*Primary Examiner* — Michael N Orlando
*Assistant Examiner* — Elizabeth Bradford
(74) *Attorney, Agent, or Firm* — Pai Patent & Trademark Law Firm; Chao-Chang David Pai

(57) ABSTRACT

A wiring board includes a low CTE (coefficient of thermal expansion) and high thermal conductivity isolator incorporated in a resin laminate by an adhesive and a bridging element disposed over the isolator and the resin laminate and electrically coupled to a first routing circuitry on the isolator and a second routing circuitry on the resin laminate. The isolator provides CTE-compensated contact interface for a semiconductor chip to be assembled thereon, and also provides primary heat conduction for the chip. The bridging element offers a reliable connecting channel for interconnecting contact pads on the isolator to terminal pads on the resin laminate.

7 Claims, 10 Drawing Sheets

Related U.S. Application Data application No. 14/846,987, filed on Sep. 7, 2015, and a continuation-in-part of application No. 15/080,427, filed on Mar. 24, 2018, said application No. 14/846,987 is a continuation-in-part of application No. 14/621,332, filed on Feb. 12, 2015, said application No. 15/080,427 is a continuation-in-part of application No. 14/621,332, filed on Feb. 12, 2015, and a continuation-in-part of application No. 14/846,987, filed on Sep. 7, 2015.

(60) Provisional application No. 61/949,652, filed on Mar. 7, 2014.

(51) Int. Cl.
*H01L 21/48* (2006.01)
*H01L 23/367* (2006.01)
*H05K 1/02* (2006.01)
*H05K 1/14* (2006.01)
*H05K 3/46* (2006.01)
*H01L 25/075* (2006.01)
*H01L 33/64* (2010.01)

(52) U.S. Cl.
CPC . *H05K 2203/049* (2013.01); *H05K 2203/063* (2013.01); *Y02P 70/611* (2015.11)

(56) References Cited

U.S. PATENT DOCUMENTS

| | | |
|---|---|---|
| 8,263,434 B2 | 9/2012 | Pagaila et al. |
| 8,895,998 B2 | 11/2014 | Hussell et al. |
| 2008/0087992 A1* | 4/2008 | Shi .................... H01L 23/49524 257/670 |
| 2010/0003787 A1* | 1/2010 | Wang .................. H01L 23/3677 438/118 |
| 2014/0144677 A1* | 5/2014 | Wang .................. H05K 1/0206 174/252 |

\* cited by examiner

WIRING BOARD HAVING ISOLATOR AND BRIDGING ELEMENT AND METHOD OF MAKING WIRING BOARD

CROSS REFERENCE TO RELATED APPLICATIONS

This application is a continuation-in-part of U.S. application Ser. No. 14/621,332 filed Feb. 12, 2015, a continuation-in-part of U.S. application Ser. No. 14/846,987 filed Sep. 7, 2015 and a continuation-in-part of U.S. application Ser. No. 15/080,427 filed Mar. 24, 2016. The U.S. application Ser. No. 14/621,332 claims the priority benefit of U.S. Provisional Application Ser. No. 61/949,652 filed Mar. 7, 2014. The U.S. application Ser. No. 14/846,987 is a continuation-in-part of U.S. application Ser. No. 14/621,332 filed Feb. 12, 2015. The U.S. application Ser. No. 15/080,427 is a continuation-in-part of U.S. application Ser. No. 14/621,332 filed Feb. 12, 2015 and a continuation-in-part of U.S. application Ser. No. 14/846,987 filed Sep. 7, 2015. The entirety of each of said applications is incorporated herein by reference.

FIELD OF THE INVENTION

The present invention relates to a wiring board and, more particularly, to a wiring board having an isolator incorporated in a resin laminate and a bridging element disposed over the isolator and the resin laminate, and a method of making the wiring board.

DESCRIPTION OF RELATED ART

High voltage or high current applications such as power module or light emitting diode (LED) often requires a high thermally conductive, electrically insulative and low CTE (Coefficient of Thermal Expansion) board for signal transmission. U.S. Pat. Nos. 8,895,998 and 7,670,872 disclose various interconnect structures using ceramics for such purposes. Due to the ceramic material is brittle and tends to crack during handling, a resin board disposed around its peripheral edges can greatly improve its mechanical stability. However, as there exists a large mis-matched CTE between ceramic and resin board, routing circuitry disposed on the ceramic/resin interface is prone to crack or delamination during thermal cycling, making this type of circuit board prohibitively unreliable for practical usage.

SUMMARY OF THE INVENTION

A primary objective of the present invention is to provide a wiring board having a low-CTE and high thermal conductivity isolator embedded in a resin laminate so as to resolve the chip/board CTE mismatch problem, thereby improving the mechanical reliability and thermal character of the semiconductor assembly.

Another objective of the present invention is to provide a wiring board in which a routing circuitry on the isolator is electrically connected to another routing circuitry on the resin laminate by a bridging element, thereby allowing a reliable electrical connection over the isolator/resin laminate interface.

In accordance with the foregoing and other objectives, the present invention provides a wiring board having an isolator, a resin laminate, a first routing circuitry, a second routing circuitry, and a bridging element. The isolator provides CTE-compensated contact interface for a semiconductor chip, and also provides primary heat conduction for the chip so that the heat generated by the chip can be conducted away. The resin laminate, disposed around peripheral edges of the isolator, is attached to the isolator by an adhesive and provides mechanical support for the wiring board. The first routing circuitry, disposed on the top surface of the isolator, provides electrical contacts for chip attachment. The second routing circuitry, disposed on the top surface of the resin laminate, provides electrical contacts for external connection. The bridging element, disposed over the isolator and the resin laminate, provides an electrical connection between the first routing circuitry and the second routing circuitry.

In another aspect, the present invention provides a wiring board having an isolator and a bridging element, comprising: a resin laminate having a planar top surface, a planar bottom surface and an aperture, wherein the aperture has interior sidewalls extending through the resin laminate between the top surface and the bottom surface thereof; an isolator having a planar top surface and a planar bottom surface and disposed in the aperture of the resin laminate, wherein peripheral edges of the isolator are attached to the interior sidewalls of the resin laminate by an adhesive; a first routing circuitry disposed on the top surface of the isolator; a second routing circuitry disposed on the top surface of the resin laminate, wherein the first routing circuitry and the second routing circuitry are spaced apart from each other; and a bridging element that is disposed over the isolator and the resin laminate and electrically connects the first routing circuitry and the second routing circuitry. Further, the present invention also provides a semiconductor assembly that includes a semiconductor device mounted over the isolator of the aforementioned wiring board and electrically connected to the first routing circuitry on the isolator.

In yet another aspect, the present invention provides a method of making a wiring board having an isolator and a bridging element, comprising steps of: forming a first routing circuitry on a planar surface of an isolator; forming a second routing circuitry on a planar surface of a resin laminate; inserting the isolator with the first routing circuitry thereon into an aperture of the resin laminate with outer surfaces of the first routing circuitry and the second routing circuitry facing towards the same direction, wherein the aperture has interior sidewalls extending through the resin laminate and laterally surrounding peripheral edges of the isolator; providing an adhesive in a gap located in the aperture between the interior sidewalls of the resin laminate and the peripheral edges of the isolator; and attaching a bridging element over the isolator and the resin laminate and electrically coupling the first routing circuitry and the second routing circuitry.

Unless specifically indicated or using the term "then" between steps, or steps necessarily occurring in a certain order, the sequence of the above-mentioned steps is not limited to that set forth above and may be changed or reordered according to desired design.

The wiring board and the method of making the same according to the present invention have numerous advantages. For instance, binding the resin laminate to the isolator can provide a platform for high resolution circuitries disposed thereon, thereby allowing fine pitch assemblies such as flip chip and surface mount component to be assembled on the board. Disposing the bridging element over the isolator and the resin laminate can offer a reliable connecting channel for interconnecting contact pads on the isolator to terminal pads on the resin laminate.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-12 are schematic views showing a method of making a wiring board that includes an isolator, a resin laminate, an adhesive, a bottom metal film, a bottom metal layer, a first routing circuitry, a second routing circuitry and bridging elements in accordance with the first embodiment of the present invention.

Figure 1:
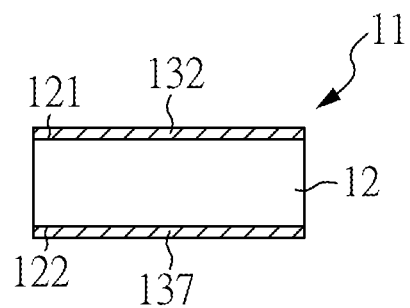
FIG. 1 is a cross-sectional view of a metallized slug in accordance with the first embodiment of the present invention.

FIG. 1 is a cross-sectional view of a metallized slug 11 having a top metal film 132 and a bottom metal film 137 respectively deposited on planar top and bottom surfaces 121, 122 of an isolator 12. The isolator 12 typically has high elastic modulus and low coefficient of thermal expansion (for example, $2 \times 10^{-6} K^{-1}$ to $10 \times 10^{-6} K^{-1}$), such as ceramic, glass, insulated semiconductor, or other thermally conductive and electrically insulating materials. In this embodiment, the isolator 12 is a ceramic plate of 0.4 mm in thickness. The top metal film 132 and the bottom metal film 137 each have a planar outer surface and are typically made of copper and each have a thickness of 35 microns.

Figure 2:
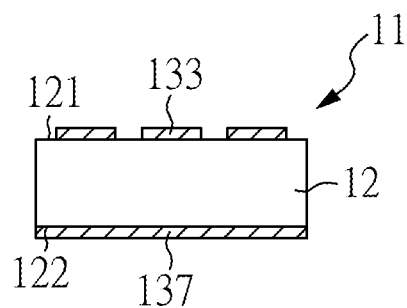
FIGS. 2 and 3 are cross-sectional and top perspective views, respectively, of a metallized slug with a first routing circuitry on an isolator in accordance with the first embodiment of the present invention.
Figure 3:
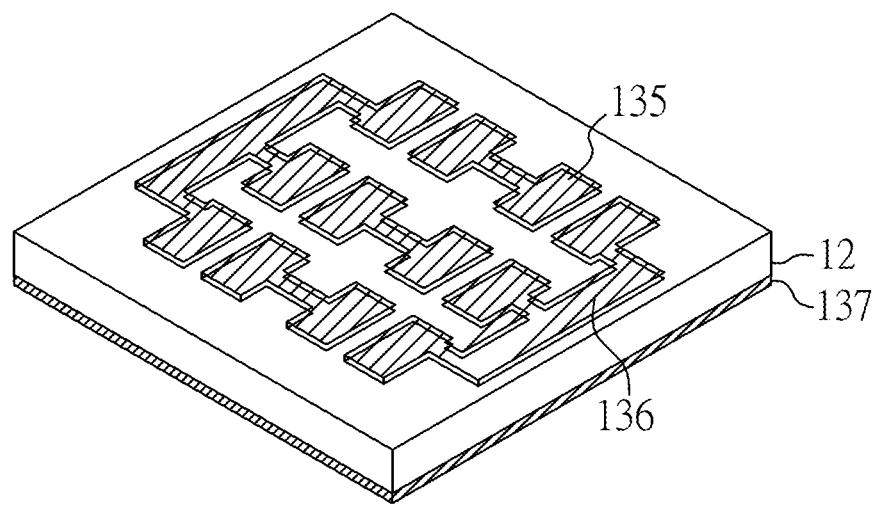

FIGS. 2 and 3 are cross-sectional and top perspective views, respectively, of the metallized slug 11 with a first routing circuitry 133 formed on the top surface 121 of the isolator 12 by metal patterning process of the top metal film 132. The metal patterning techniques include wet etching, electro-chemical etching, laser-assist etching, and their combinations with an etch mask (not shown) thereon that defines the first routing circuitry 133. As shown in FIG. 3, the first routing circuitry 133 includes bond pads 135 and contact pads 136 electrically connected to each other.

Figure 4:
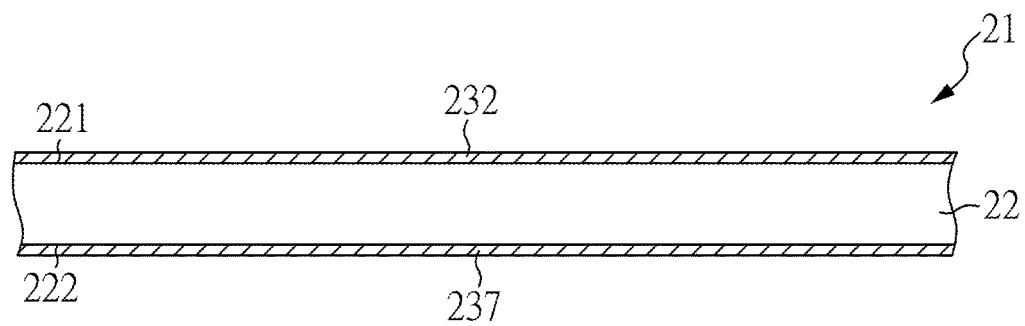
FIG. 4 is a cross-sectional view of a metallized sheet in accordance with the first embodiment of the present invention.

FIG. 4 is a cross-sectional view of a metallized sheet 21 having a top metal layer 232 and a bottom metal layer 237 respectively deposited on planar top and bottom surfaces 221, 222 of a resin laminate 22. The resin laminate 22 typically is made of epoxy resin, glass-epoxy, polyimide or the like, and has a thickness of 0.4 mm. The top and bottom metal layers 232, 237 each have a planar outer surface and typically are made of copper, and each have a thickness of 35 microns.

Figure 5:
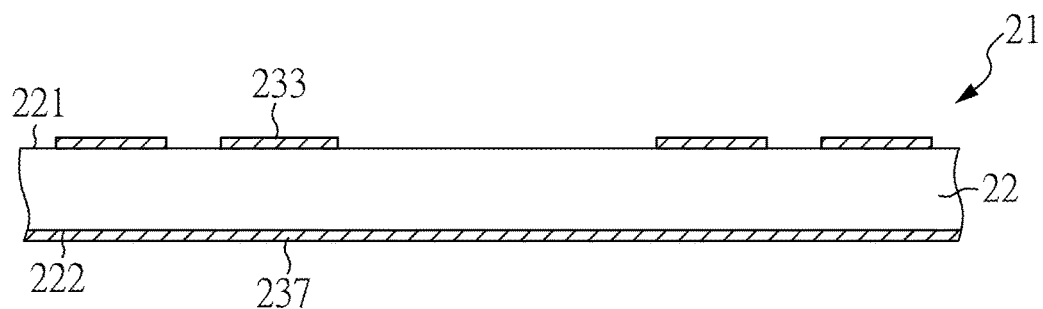
FIGS. 5 and 6 are cross-sectional and top perspective views, respectively, of a metallized sheet with a second routing circuitry on a resin laminate in accordance with the first embodiment of the present invention.
Figure 6:
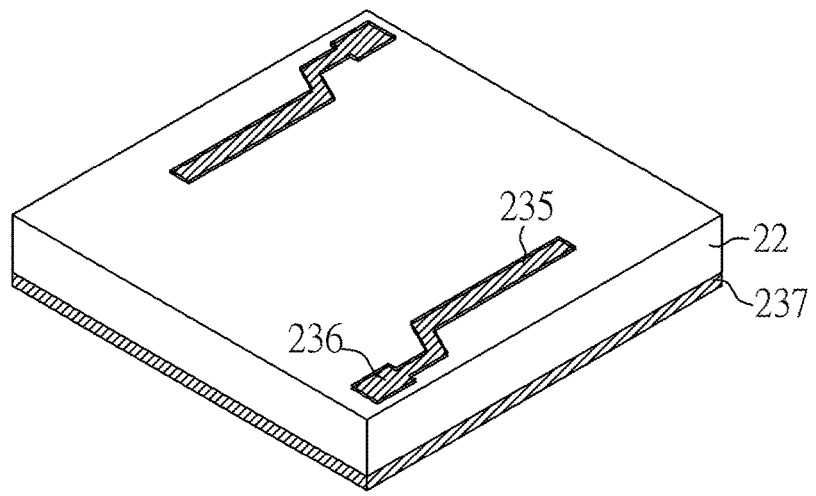

FIGS. 5 and 6 are cross-sectional and top perspective views, respectively, of the metallized sheet 21 with a second routing circuitry 233 formed on the resin laminate 22. By metal patterning process of the top metal layer 232, the second routing circuitry 233 is formed on the top surface 221 of the resin laminate 22. As shown in FIG. 6, the second routing circuitry 233 includes terminal pads 235 and interconnect pads 236 electrically connected to each other.

Figure 7:
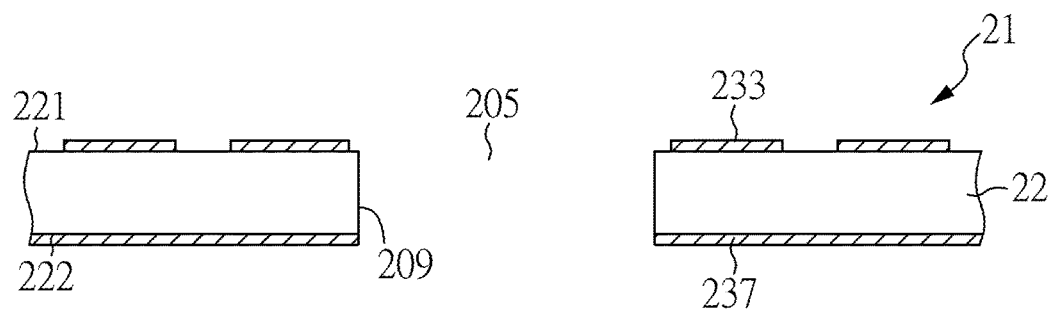
FIG. 7 is a cross-sectional view of the metallized sheet of FIG. 5 further provided with an aperture in accordance with the first embodiment of the present invention.

FIG. 7 is a cross-sectional view of the metallized sheet 21 formed with an aperture 205. The aperture 205 has interior sidewalls 209 extending through the resin laminate 22 between the top surface 221 and the bottom surface 222 thereof as well as the bottom metal layer 237. The aperture 205 can be formed by numerous techniques, such as punching or laser cutting.

Figure 8:
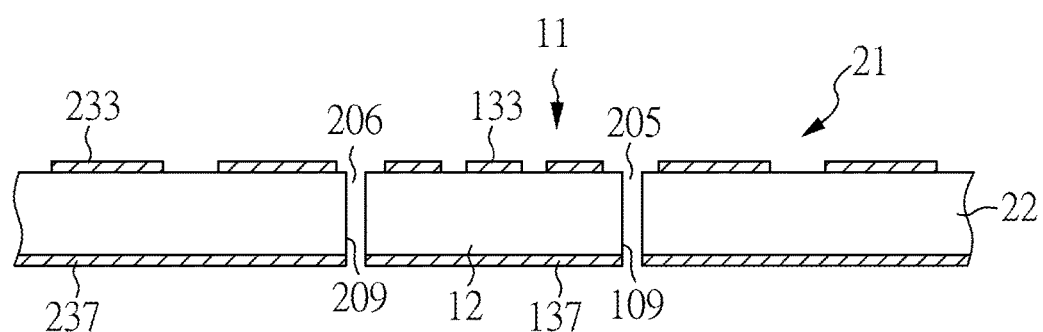
FIGS. 8 and 9 are cross-sectional and top perspective views, respectively, of the metallized slug of FIG. 2 inserted into the aperture of the metallized sheet of FIG. 7 in accordance with the first embodiment of the present invention.
Figure 9:
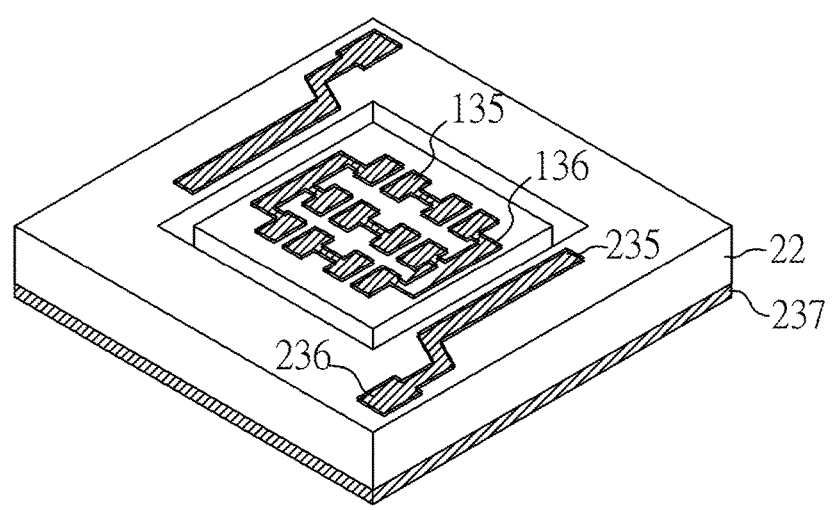

FIGS. 8 and 9 are cross-sectional and top perspective views, respectively, of the structure with the metallized slug 11 accommodated in the aperture 205 of the metallized sheet 21. The metallized slug 11 is aligned with and inserted into the aperture 205 of the metallized sheet 21, with the outer surfaces of the first routing circuitry 133 and the second routing circuitry 233 facing in the upward direction and substantially coplanar with each other. The interior sidewalls 209 of the aperture 205 laterally surround and are spaced from peripheral edges 109 of the metallized slug 11. As a result, a gap 206 is located in the aperture 205 between the peripheral edges 109 of the metallized slug 11 and the interior sidewalls 209 of the metallized sheet 21. The gap 206 laterally surrounds the metallized slug 11 and is laterally surrounded by the metallized sheet 21.

Figure 10:
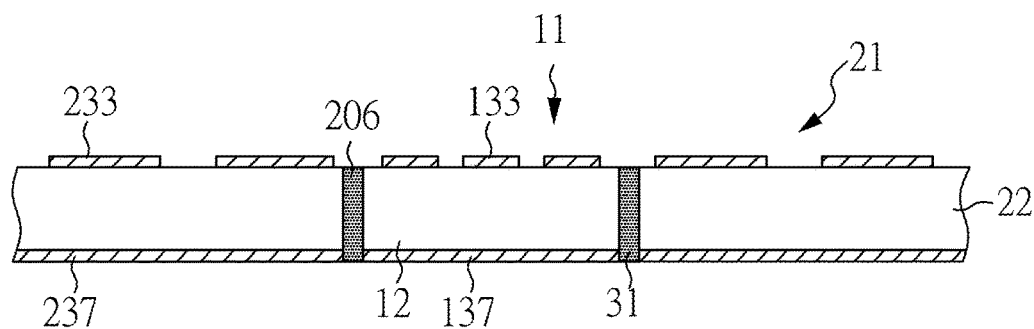
FIG. 10 is a cross-sectional view of the structure of FIG. 8 further provided with an adhesive in accordance with the first embodiment of the present invention.

FIG. 10 is a cross-sectional view of the structure with an adhesive 31 dispensed in the gap 206. The adhesive 31 fills the gap 206 and provides a secure robust mechanical bond between the metallized slug 11 and the metallized sheet 21.

Figure 11:
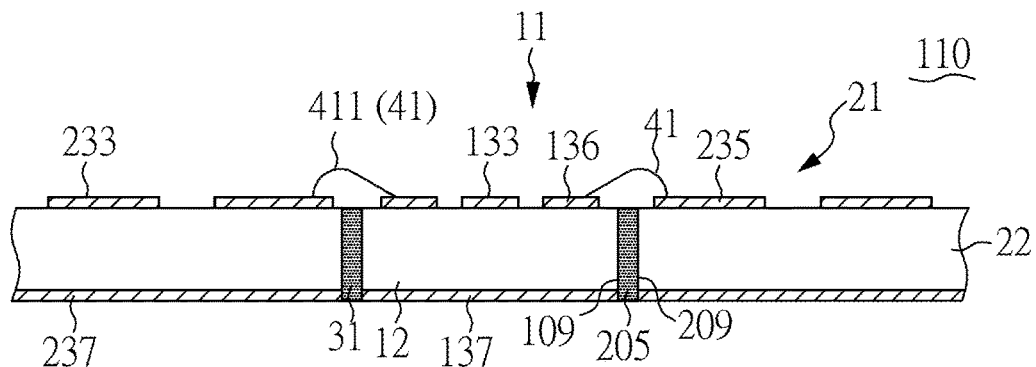
FIGS. 11 and 12 are cross-sectional and top perspective views, respectively, of the structure of FIG. 10 further provided with bridging elements to finish the fabrication of a wiring board in accordance with the first embodiment of the present invention.
Figure 12:
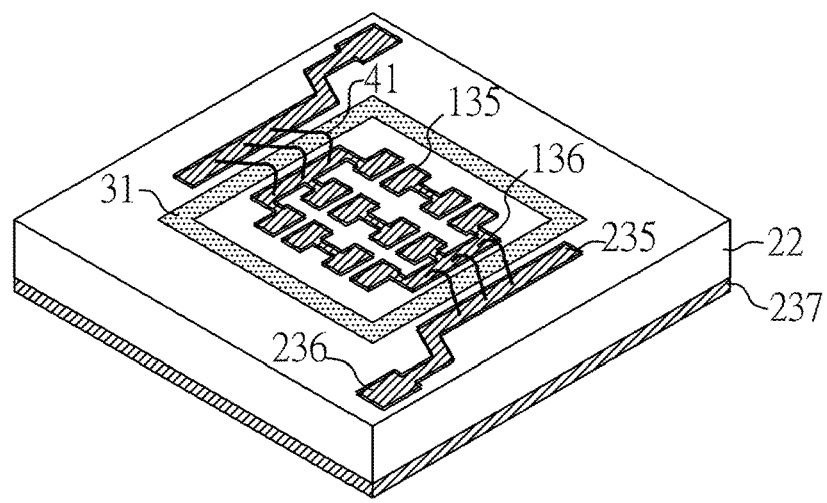

FIGS. 11 and 12 are cross-sectional and top perspective views, respectively, of the structure with bonding wires 411 in contact with the first routing circuitry 133 and the second routing circuitry 233. The bonding wires 411 are electrically coupled to the contact pads 136 on the isolator 12 and the terminal pads 235 on the resin laminate 22 typically by gold or copper ball bonding, or gold or aluminum wedge bonding. As a result, the bonding wires 411 can serve as bridging elements 41 that span gaps between peripheral edges of the contact pads 136 and the terminal pads 235 to electrically connect the first routing circuitry 133 and the second routing circuitry 233.

Accordingly, as shown in FIGS. 11 and 12, a wiring board 110 is accomplished and includes an isolator 12, a first routing circuitry 133, a bottom metal film 137, a resin laminate 22, a second routing circuitry 233, a bottom metal layer 237, an adhesive 31, and bridge elements 41. The isolator 12 is disposed in an aperture 205 of the resin laminate 22 and has peripheral edges 109 attached to interior sidewalls 209 of the resin laminate 22 by the adhesive 31 in contact with the peripheral edges 109 of the isolator 12 and the interior sidewalls 209 of the resin laminate 22. The first routing circuitry 133 and the second routing circuitry 233 are patterned metal layers deposited on the isolator 12 and the resin laminate 22, respectively. The bottom metal film 137 and the bottom metal layer 237 are unpatterned metal plates disposed underneath the isolator 12 and the resin laminate 22, respectively. The first routing circuitry 133 includes bond pads 135 for chip attachment and contact pads 136 for bridging element connection, whereas the second routing circuitry 233 includes terminal pads 235 for bridging element connection and interconnect pads 236 for external connection. The bridging elements 41 are attached to the first routing circuitry 133 and the second routing circuitry 233 and electrically connect the contact pads 136 and the terminal pads 235. As a result, the bond pads 135 are electrically connected to the interconnect pads 236 through the contact pads 136, the terminal pads 235 and the bridging elements 41.

Figure 13:
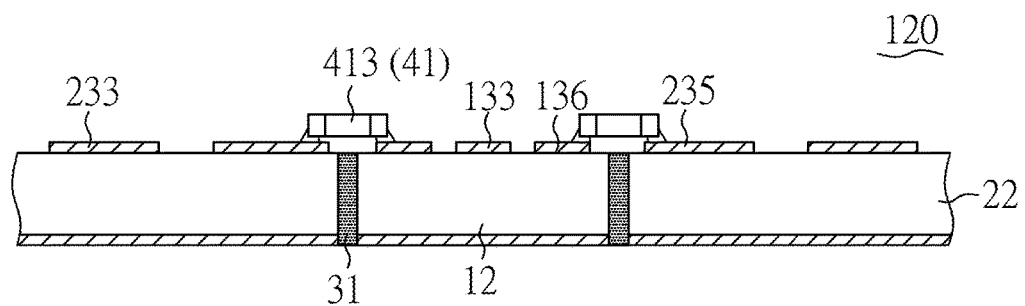
FIG. 13 is a cross-sectional view of another aspect of the wiring board in accordance with the first embodiment of the present invention.

FIG. 13 is a cross-sectional view of another aspect of the wiring board according to the first embodiment of the present invention. The wiring board 120 is similar to that illustrated in FIG. 11, except that it includes surface mounted devices 413 as the bridging elements 41. The surface mounted devices 413 are adhered to the contact pads 136 of the first routing circuitry 133 and the terminal pads 235 of the second routing circuitry 233 by soldering material.

Figure 14:
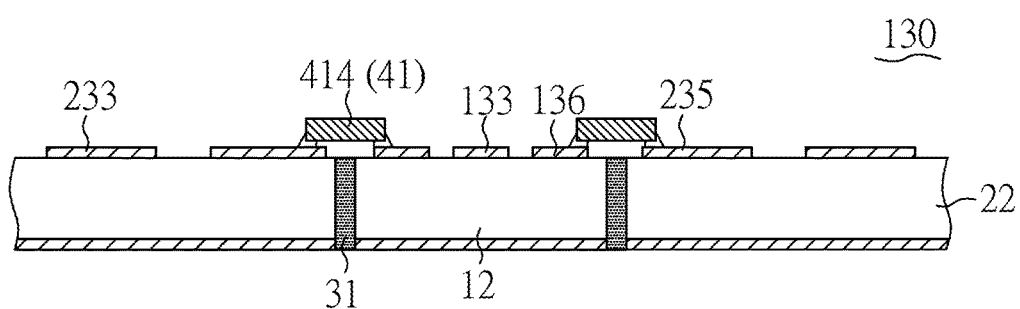
FIG. 14 is a cross-sectional view of yet another aspect of the wiring board in accordance with the first embodiment of the present invention.

FIG. 14 is a cross-sectional view of yet another aspect of the wiring board according to the first embodiment of the present invention. The wiring board 130 is similar to that illustrated in FIG. 11, except that it includes metal plates 414 as the bridging elements 41. The metal plates 414 are adhered to the contact pads 136 of the first routing circuitry 133 and the terminal pads 235 of the second routing circuitry 233 by soldering material.

Figure 15:
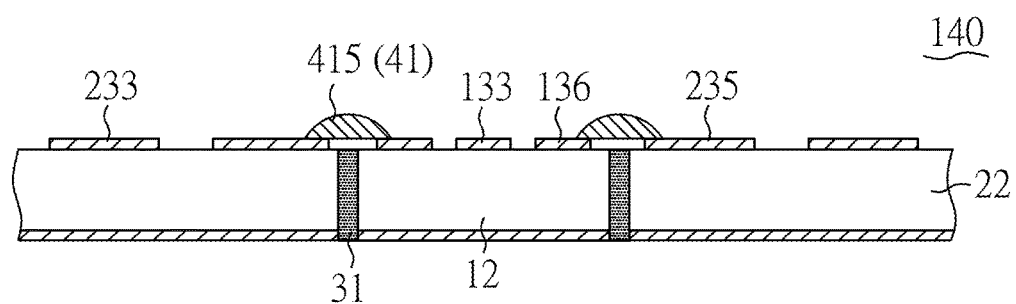
FIG. 15 is a cross-sectional view of yet another aspect of the wiring board in accordance with the first embodiment of the present invention.

FIG. 15 is a cross-sectional view of yet another aspect of the wiring board according to the first embodiment of the present invention. The wiring board 140 is similar to that illustrated in FIG. 11, except that it includes soldering material 415 as the bridging elements 41. The soldering material 415 contact the contact pads 136 of the first routing circuitry 133 and the terminal pads 235 of the second routing circuitry 233 and span gaps between peripheral edges of the contact pads 136 and the terminal pads 235.

Figure 16:
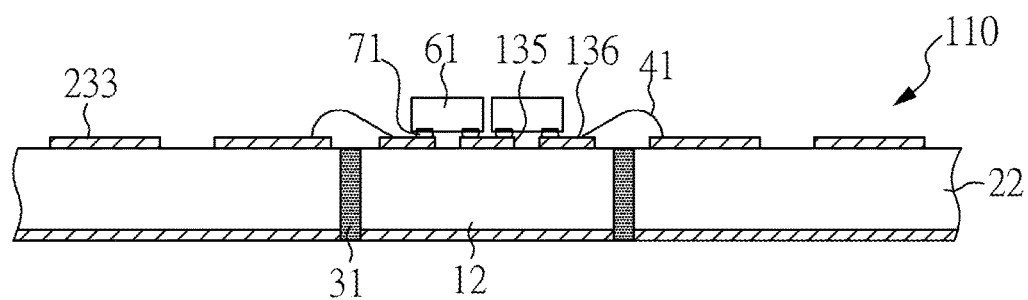
FIGS. 16 and 17 are cross-sectional and top perspective views, respectively, of a semiconductor assembly with semiconductor devices mounted on the wiring board of FIGS. 11 and 12 in accordance with the first embodiment of the present invention.
Figure 17:
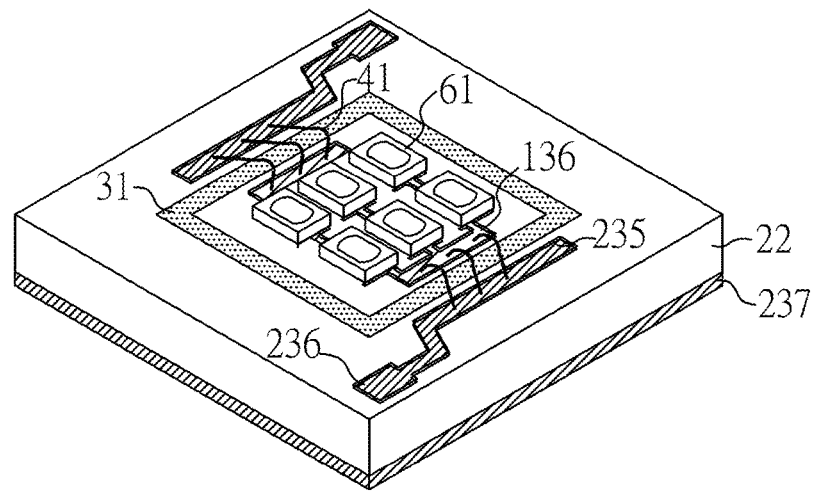

FIGS. 16 and 17 are cross-sectional and top perspective views, respectively, of a semiconductor assembly with semiconductor devices 61 electrically connected to the wiring board 110 illustrated in FIG. 11. The semiconductor devices 61, illustrated as LED chips, are flip-chip coupled to the bond pads 135 on the isolator 12 via bumps 71. As a result, the semiconductor devices 61 are electrically connected to the second routing circuitry 233 on the resin laminate 22 through the bond pads 135, the contact pads 136, and the bridging elements 41.

Figure 18:
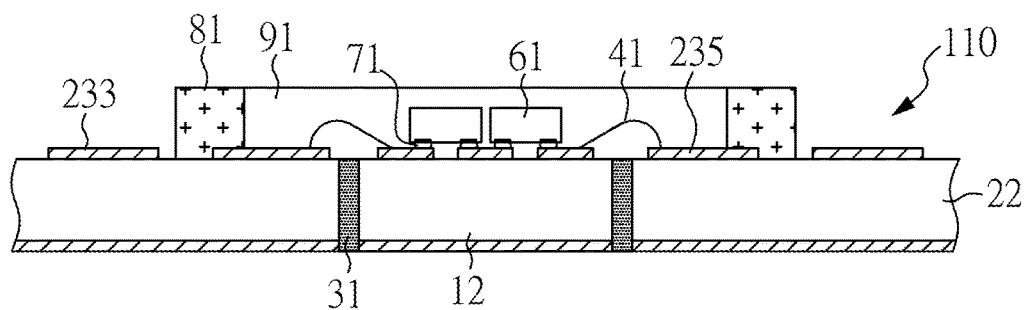
FIG. 18 is a cross-sectional view of the structure of FIG. 16 further provided with a dam and an encapsulant in accordance with the first embodiment of the present invention.

FIG. 18 is a cross-sectional view of the semiconductor assembly further provided with a dam 81 and an encapsulant 91. The dam 81 is provided on the wiring board 110, and the encapsulant 91 is dispensed in the area surrounded by the dam 81 to enclose the semiconductor devices 61.

Embodiment 2

FIGS. 19-23 are schematic views showing another method of making a wiring board in which a stacking structure is provided for a lamination process in accordance with the second embodiment of the present invention.

For purposes of brevity, any description in Embodiment 1 above is incorporated herein insofar as the same is applicable, and the same description need not be repeated.

Figure 19:
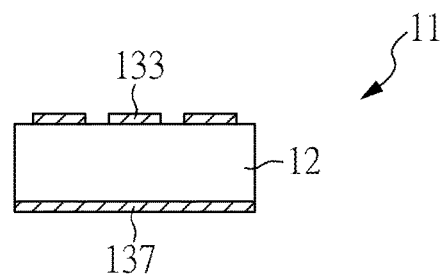
FIG. 19 is a cross-sectional view of a metallized slug with a first routing circuitry on an isolator in accordance with the second embodiment of the present invention.

FIG. 19 is a cross-sectional view of a metallized slug 11 with a first routing circuitry 133 and a bottom metal film 137 on two opposite surfaces of an isolator 12, respectively. The first routing circuitry 133 is a patterned metal layer disposed on the top surface of the isolator 12, whereas the bottom metal film 137 is an unpatterned metal plate covering the isolator 12 from below.

Figure 20:
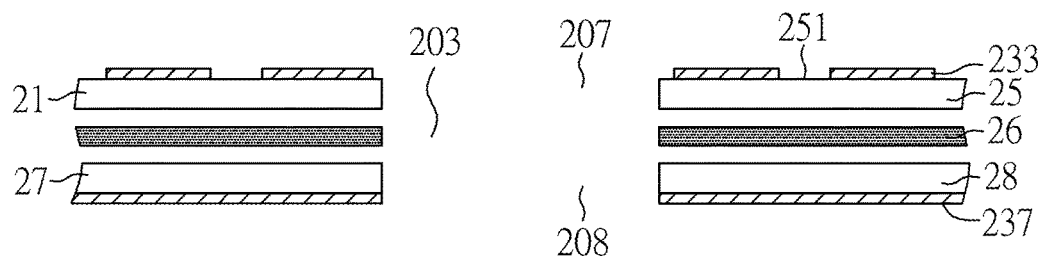
FIG. 20 is a cross-sectional view of a stacking structure having a metallized sheet, a binding film and a bottom sheet in accordance with the second embodiment of the present invention.

FIG. 20 is a cross-sectional view of a stacking structure having a metallized sheet 21, a binding film 26 and a bottom sheet 27. The binding film 26 is disposed between the metallized sheet 21 and the bottom sheet 27, and has an opening 203 aligned with apertures 207, 208 of the metallized sheet 21 and the bottom sheet 27. In this illustration, the metallized sheet 21 includes a second routing circuitry 233 disposed on a first resin laminate 25, and the bottom sheet 27 includes a bottom metal layer 237 disposed underneath a second resin laminate 28. The first resin laminate 25 and the second resin laminate 28 typically are made of epoxy resin, glass-epoxy, polyimide or the like. The second routing circuitry 233 is a patterned metal layer disposed on the top surface 251 of the first resin laminate 25, whereas the bottom metal layer 237 is an unpatterned metal plate covering the second resin laminate 28 from below. The binding film 26 can be various dielectric films or prepregs formed from numerous organic or inorganic electrical insulators. For instance, the binding film 26 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable. In this embodiment, the binding film 26 is a prepreg with B-stage uncured epoxy provided as a non-solidified sheet.

Figure 21:
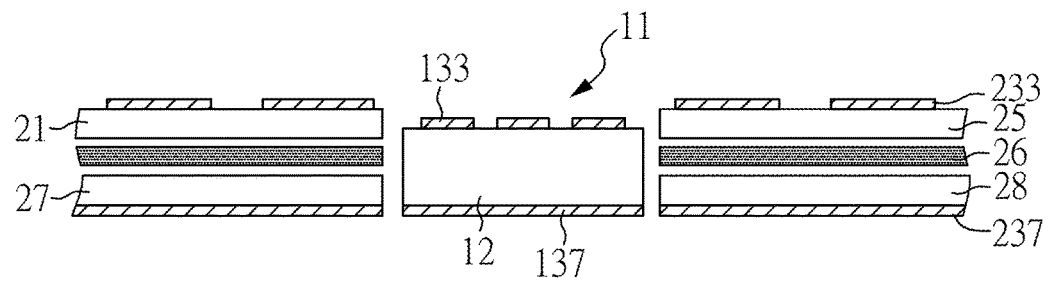
FIG. 21 is a cross-sectional view of the metallized slug of FIG. 19 surrounded by the stacking structure of FIG. 20 in accordance with the second embodiment of the present invention.

FIG. 21 is a cross-sectional view of the metallized slug 11 of FIG. 19 inserted into the apertures 207, 208 of the metallized sheet 21 and the bottom sheet 27 as well as the opening 203 of the binding film 26. In this illustration, the outer surfaces of the first routing circuitry 133 and the second routing circuitry 233 face in the upward direction.

Figure 22:
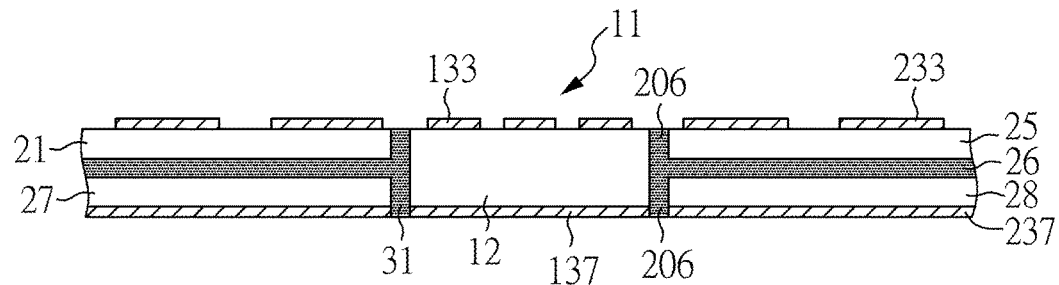
FIG. 22 is a cross-sectional view of the structure of FIG. 21 after a lamination process in accordance with the second embodiment of the present invention.

FIG. 22 is a cross-sectional view of the structure with metallized slug 11 attached to the metallized sheet 21 and the bottom sheet 27 by an adhesive 31 in gaps 206 between the metallized slug 11 and the metallized sheet 21 and between the metallized slug 11 and the bottom sheet 27. By applying heat and pressure, the binding film 26 is squeezed and part of the adhesive in the binding film 26 flows into the gaps 206. The binding film 26 is compressed by applying downward pressure to the metallized sheet 21 and/or upward pressure to the bottom sheet 27, thereby moving the metallized sheet 21 and the bottom sheet 27 towards each other and applying pressure to the binding film 26 while simultaneously applying heat to the binding film 26. The binding film 26 becomes compliant enough under the heat and pressure to conform to virtually any shape. As a result, the binding film 26 sandwiched between the metallized sheet 21 and the bottom sheet 27 is compressed, forced out of its original shape and flows into the gaps 206. The metallized sheet 21 and the bottom sheet 27 continue to move towards each other, and the binding film 26 remains sandwiched between and continues to fill the reduced space between the metallized sheet 21 and the bottom sheet 27. Meanwhile, the adhesive 31 squeezed out from the binding film 26 fills the gaps 206. The motion eventually stops when the outer surface of the second routing circuitry 233 becomes coplanar with that of the first routing circuitry 133, but heat continues to be applied to the binding film 26 and the squeezed out adhesive 31, thereby converting the B-stage molten uncured epoxy into C-stage cured or hardened epoxy.

Figure 23:
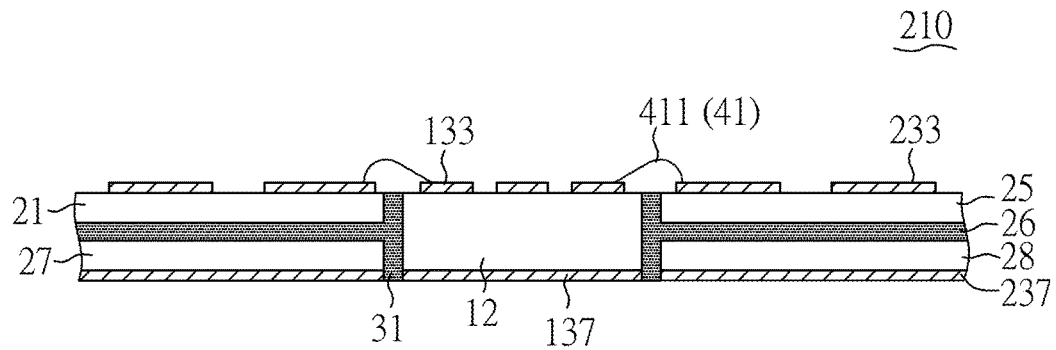
FIG. 23 is a cross-sectional view of the structure of FIG. 22 further provided with bridging elements to finish the fabrication of a wiring board in accordance with the second embodiment of the present invention.

FIG. 23 is a cross-sectional view of the structure with bridging elements 41 on the first routing circuitry 133 and the second routing circuitry 233. The bridging elements 41 contact the first routing circuitry 133 and the second routing circuitry 233, and span gaps between peripheral edges of the first routing circuitry 133 and the second routing circuitry 233. In this aspect, the bridging elements 41 are illustrated as bonding wires 411. However, as illustrated in FIGS. 13, 14 and 15, the bridging elements 41 may be surface mounted devices, metal plates, or soldering material.

Accordingly, as shown in FIG. 23, a wiring board 210 is accomplished and includes an isolator 12, a first routing circuitry 133, a bottom metal film 137, a second routing circuitry 233, a first resin laminate 25, a binding film 26, a second resin laminate 28, a bottom metal layer 237, an adhesive 31, and bridge elements 41. The first resin laminate 25 and the second resin laminate 28 surround peripheral edges of the isolator 12 and are mechanically connected to the isolator 12 by the adhesive 31 squeezed out from the binding film 26 between the first resin laminate 25 and the second resin laminate 28. The first routing circuitry 133 and the second routing circuitry 233 are deposited on the top surfaces of the isolator 12 and the first resin laminate 25, respectively, and spaced from each other. The bottom metal film 137 and the bottom metal layer 237 covers the isolator 12 and the second resin laminate 28 from below, respectively. The bridging elements 41 span gaps between the first routing circuitry 133 and the second routing circuitry 233 to provide electrical connection between the first routing circuitry 133 and the second routing circuitry 233.

Figure 24:
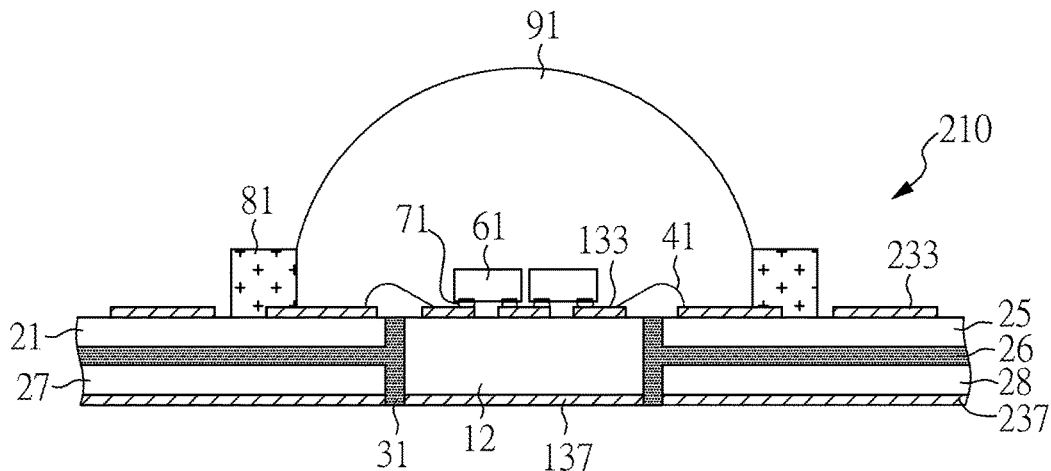
FIG. 24 is a cross-sectional view of a semiconductor assembly with semiconductor devices mounted on the wiring board of FIG. 23 in accordance with the second embodiment of the present invention.

FIG. 24 is a cross-sectional view of a semiconductor assembly with semiconductor devices 61 electrically connected to the wiring board 210 illustrated in FIG. 23. The semiconductor devices 61, illustrated as LED chips, are flip-chip mounted on the first routing circuitry 133 via bumps 71. Further, a dam 81 is provided on the wiring board 210, and an encapsulant 91 is dispensed in the area surrounded by the dam 81 to enclose the semiconductor devices 61.

Figure 25:
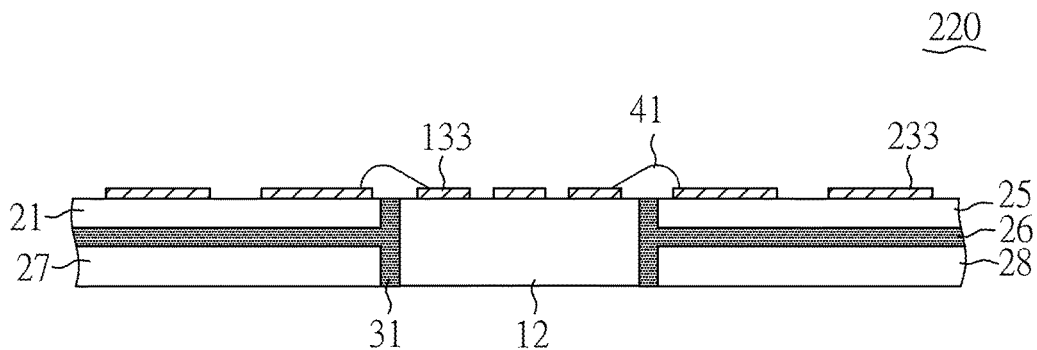
FIG. 25 is a cross-sectional view of another aspect of the wiring board in accordance with the second embodiment of the present invention.

FIG. 25 is a cross-sectional view of another aspect of the wiring board according to the second embodiment of the present invention. The wiring board 220 is similar to that illustrated in FIG. 23, except that no bottom metal film and bottom metal layer cover the isolator 12 and the second resin laminate 28 from below.

Embodiment 3

FIGS. 26-31 are schematic views showing a method of making a wiring board with a thermal base laterally extending beyond peripheral edges of the isolator in accordance with the third embodiment of the present invention.

For purposes of brevity, any description in Embodiments above is incorporated herein insofar as the same is applicable, and the same description need not be repeated.

Figure 26:
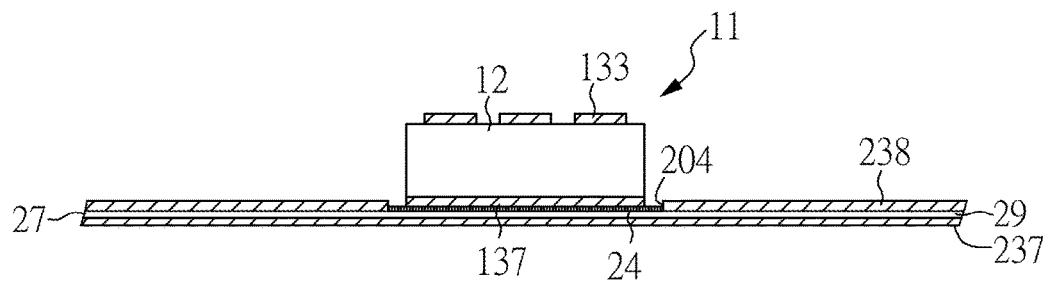
FIG. 26 is a cross-sectional view of a metallized slug attached on a bottom sheet in accordance with the third embodiment of the present invention.

FIG. 26 is a cross-sectional view of the structure with the metallized slug 11 of FIG. 19 disposed on a bottom sheet 27. The bottom sheet 27 includes a bottom metal layer 237, a dielectric layer 29 and an alignment guide 238. The dielectric layer 29 typically is made of epoxy resin, glass-epoxy, polyimide or the like, and has a thickness of 0.15 mm. The bottom metal layer 237 covers the dielectric layer 29 from below, whereas the alignment guide 238 projects from the top surface of the dielectric layer 29 and can have a thickness of 5 to 200 microns. The alignment guide 238 can be pattern deposited by numerous techniques, such as electroplating, electroless plating, evaporating, sputtering or their combinations using photolithographic process, or by a metal patterning process. In this illustration, the alignment guide 238 laterally extends to the peripheral edges of the bottom sheet 27, and has inner peripheral edges 204 that surround a placement area for the metallized slug 11. However, the alignment guide patterns are not limited thereto and can be in other various patterns against undesirable movement of the subsequently disposed metallized slug. For instance, the alignment guide 238 may consist of plural posts or a continuous or discontinuous strip and conform to four sides, two diagonal corners or four corners of the subsequently disposed metallized slug 11. Accordingly, the placement accuracy of the metallized slug 11 is provided by the alignment guide 238. The metallized slug 11 is disposed at the placement area and attached to the bottom sheet 27 typically by a thermally conductive adhesive 24 in contact with the bottom metal film 137 of the metallized slug 11 and the dielectric layer 29 of the bottom sheet 27. Because the alignment guide 238 extends beyond the attached surface of the metallized slug 11 in the upward direction and is laterally aligned with and in close proximity to peripheral edges of the metallized slug 11, any undesirable movement of the metallized slug 11 due to adhesive curing can be avoided. Additionally, the metallized slug 11 also may be attached without the alignment guide 238.

Figure 27:
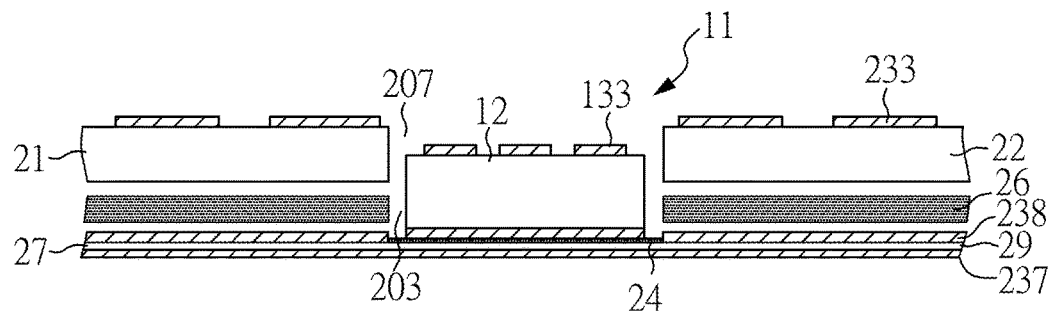
FIG. 27 is a cross-sectional view of the structure of FIG. 26 further provided with a binding film and a metallized sheet in accordance with the third embodiment of the present invention.

FIG. 27 is a cross-sectional view of the structure with a binding film 26 and a metallized sheet 21 on the bottom sheet 27. The binding film 26 is disposed between the metallized sheet 21 and the bottom sheet 27, and the metallized slug 11 is inserted into an aperture 207 of the metallized sheet 21 as well as an opening 203 of the binding film 26. In this illustration, the metallized sheet 21 includes a resin laminate 22 and a second routing circuitry 233 on the top surface of the resin laminate 22.

Figure 28:
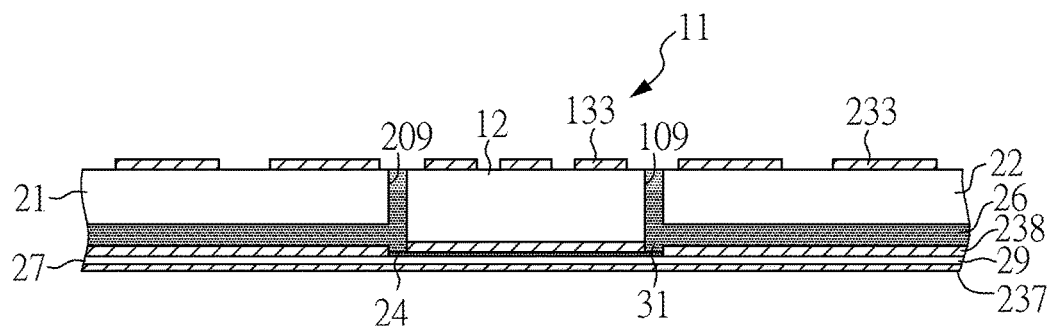
FIG. 28 is a cross-sectional view of the structure of FIG. 27 after a lamination process in accordance with the third embodiment of the present invention.

FIG. 28 is a cross-sectional view of the structure with the metallized slug 11 attached to the metallized sheet 21 by an adhesive 31 in a gap between peripheral edges 109 of the isolator 12 and interior sidewalls 209 of the resin laminate 22. By applying heat and pressure, the binding film 26 is squeezed and part of the adhesive in the binding film 26 flows into the gap between the metallized slug 11 and the metallized sheet 21. As a result, the resin laminate 22 is mechanically connected to the isolator 12 by the adhesive 31, and also mechanically connected to the bottom sheet 27 by the binding film 26.

Figure 29:
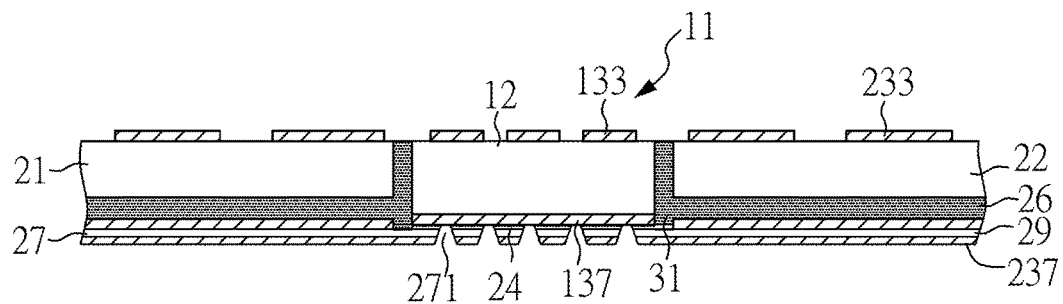
FIG. 29 is a cross-sectional view of the structure of FIG. 28 further provided with via openings in accordance with the third embodiment of the present invention.

FIG. 29 is a cross-sectional view of the structure provided with via openings 271 in the bottom sheet 27. The via openings 271 are formed by numerous techniques, such as laser drilling, plasma etching and photolithography, and typically have a diameter of 50 microns. Laser drilling can be enhanced by a pulsed laser. Alternatively, a scanning laser beam with a metal mask can be used. The via openings 271 extend through the bottom metal layer 237 and the dielectric layer 29 as well as the thermally conductive adhesive 24, and are aligned with selected portions of the bottom metal film 137 of the metallized slug 11.

Figure 30:
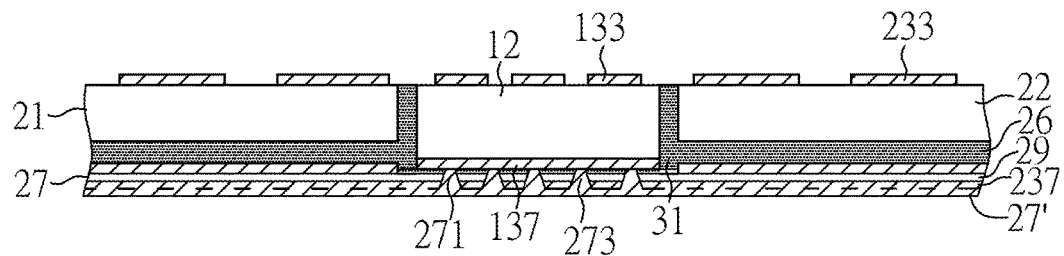
FIG. 30 is a cross-sectional view of the structure of FIG. 29 further provided with a plated layer in accordance with the third embodiment of the present invention.

FIG. 30 is a cross-sectional view of the structure provided with a plated layer 27' deposited on the bottom metal layer 237 and into the via openings 271 by numerous techniques, such as electroplating, electroless plating, evaporating, sputtering or their combinations. The plated layer 27' extends from the bottom metal film 137 in the downward direction, fill up the via openings 271 to form metallized vias 273 in direct contact with the bottom metal film 137, and extend laterally on the bottom metal layer 237. As a result, the combination of the plated layer 27' and the bottom metal layer 237 can serve as a thermal base to provide a larger thermal dissipation surface area than the isolator 12. Alternatively, if the bottom sheet 27 includes no bottom metal layer, the dielectric layer 29 may be directly metallized to form the plated layer 27' as the thermal base.

In this illustration, the bottom metal layer 237 and the plated layer 27' are shown as a single layer for convenience of illustration. The boundary (shown in broken lines) between the two metal layers may be difficult or impossible to detect since copper is plated on copper.

Figure 31:
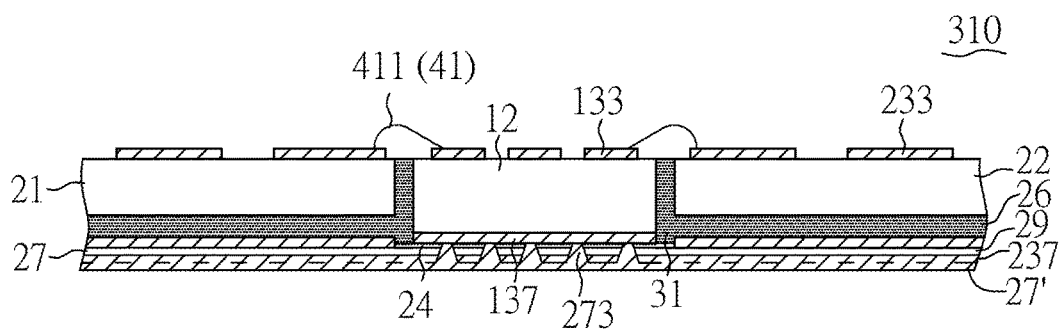
FIG. 31 is a cross-sectional view of the structure of FIG. 30 further provided with bridging elements to finish the fabrication of a wiring board in accordance with the third embodiment of the present invention.

FIG. 31 is a cross-sectional view of the structure with bridging elements 41 on the first routing circuitry 133 and the second routing circuitry 233. The bridging elements 41 contact the first routing circuitry 133 and the second routing circuitry 233, and span gaps between peripheral edges of the first routing circuitry 133 and the second routing circuitry 233. In this aspect, the bridging elements 41 are illustrated as bonding wires 411. However, as illustrated in FIGS. 13, 14 and 15, the bridging elements 41 may be surface mounted devices, metal plates, or soldering material.

Accordingly, as shown in FIG. 31, a wiring board 310 is accomplished and includes an isolator 12, a first routing circuitry 133, a bottom metal film 137, a resin laminate 22, a second routing circuitry 233, a binding film 26, a bottom sheet 27, a plated layer 27', an adhesive 31, and bridge elements 41. The isolator 12 is disposed over the bottom sheet 27 and laterally surrounded by and attached to the resin laminate 22 by the adhesive 31 squeezed out from the binding film 26 between the resin laminate 22 and the bottom sheet 27. The first routing circuitry 133 and the second routing circuitry 233 are deposited on the top surfaces of the isolator 12 and the resin laminate 22, respectively, and electrically connected to each other by the bridging elements 41. The plated layer 27' covers the bottom sheet 27 from below and includes metallized vias 273 in contact with the bottom metal film 137 underneath the isolator 12.

As illustrated in the aforementioned embodiments, a distinctive wiring board is configured to exhibit improved reliability. Preferably, the wiring board mainly includes an isolator, a resin laminate, a first routing circuitry, a second routing circuitry and a bridging element, wherein (i) the isolator is disposed in an aperture of the resin laminate; (ii) the resin laminate surrounds peripheral edges of the isolator and has interior sidewalls attached to the peripheral edges of the isolator by an adhesive; (iii) the first routing circuitry is disposed on a top surface of the isolator and has an outer surface facing away from the top surface of the isolator; (iv) the second routing circuitry is disposed on a top surface of the resin laminate and spaced from the first routing circuitry and has an outer surface facing away from the top surface of the resin laminate and substantially coplanar with that of the first routing circuitry; and (v) the bridging element is disposed over the outer surfaces of the first routing circuitry and the second routing circuitry and span a gap between peripheral edges of the first routing circuitry and the second routing circuitry and electrically connects the first routing circuitry and the second routing circuitry.

The isolator can provide a platform for chip attachment and be made of a thermally conductive and electrically insulating material. Preferably, the isolator has high elastic modulus and low coefficient of thermal expansion (for example, $2 \times 10^{-6}$ K$^{-1}$ to $10 \times 10^{-6}$ K$^{-1}$). As a result, the isolator, having CTE matching a semiconductor chip to be assembled thereon, provides a CTE-compensated contact interface for the semiconductor chip, and thus internal stresses caused by CTE mismatch can be largely compensated or reduced. Further, the isolator also provides primary heat conduction for the chip so that the heat generated by the chip can be conducted away.

The resin laminate can be bonded to the isolator by an adhesive dispensing process or a lamination process. For instance, a metallized slug, having a first routing circuitry and an optional bottom metal film respectively on top and bottom surfaces of an isolator, may be inserted into an aperture of a metallized sheet having a second routing circuitry and an optional bottom metal layer respectively on top and bottom surfaces of a resin laminate, and then an adhesive is dispensed between and contacts the peripheral edges of the metallized slug and the aperture sidewalls of the metallized sheet. As an alternative, a binding film may be provided between the metallized sheet and a bottom sheet to form a stacking structure, and the metallized slug is inserted into the aperture of the metallized sheet as well as an opening of the binding film, followed by applying heat and pressure in a lamination process. By the lamination process, the binding film can provide a secure robust mechanical bond between the resin laminate of the metallized sheet and the bottom sheet, and part of the adhesive in the binding film is squeezed out from the binding film and flows into gaps between the resin laminate of the metalized sheet and the isolator of the metallized slug. The adhesive squeezed out from the binding film laterally covers and surrounds and conformally coats the peripheral edges of the isolator and aperture sidewalls of the resin laminate so as to provide a secure robust mechanical bond between the isolator and the resin laminate. In one aspect of the present invention, the bottom sheet may have an aperture, and the metallized slug is inserted into the apertures of the metallized sheet and the bottom sheet as well as the opening of the binding film. Accordingly, after the lamination process, the metallized sheet is mechanically connected to the bottom sheet by the binding film, whereas the peripheral edges of the metallized slug are attached to aperture sidewalls of the metallized sheet and the bottom sheet by the adhesive squeezed out from the binding film. Alternatively, in another aspect of the present invention, the metallized slug may be attached on the bottom sheet preferably by a thermally conductive adhesive, and the metallized sheet surrounds the peripheral edges of the metallized slug and is mechanically connected to the bottom sheet by the binding film and to the metallized slug by the adhesive squeezed out from the binding film. In accordance with this alternative aspect, the bottom sheet can include a dielectric layer and an optional bottom metal layer underneath the dielectric layer, and a plated layer (typically a copper layer) preferably is further provided underneath the bottom sheet and includes metallized vias that extend through the bottom sheet and the thermally conductive adhesive and contact the metallized slug. Accordingly, the plated layer as well as the optional bottom metal layer can serve as a thermal base in thermally conductible to the isolator. In a preferred embodiment, as the thermal base laterally extends beyond the peripheral edges of the isolator and extends to the peripheral edges of the resin laminate, the thermal base underneath the dielectric layer can provide a larger thermal dissipation surface area than the isolator to enhance heat dissipation efficiency. Further, for the placement accuracy of the metallized slug on the bottom sheet, an alignment guide may be provided on the dielectric layer. Specifically, the alignment guide projects from the top surface of the dielectric layer, and the metallized slug is attached to the top surface of the dielectric layer with the alignment guide laterally aligned with the peripheral edges of the metallized slug. As the alignment guide extending beyond the attached surface of the metallized slug in a direction away from the top surface of the dielectric layer and in close proximity to the peripheral edges of the metallized slug, any undesirable movement of the metallized slug can be avoided.

The alignment guide can have various patterns against undesirable movement of the metallized slug. For instance, the alignment guide can include a continuous or discontinuous strip or an array of posts. Alternatively, the alignment guide may laterally extend to the peripheral edges of the bottom sheet and have inner peripheral edges that conform to the peripheral edges of the metallized slug. Specifically, the alignment guide can be laterally aligned with four lateral surfaces of the metallized slug to define an area with the same or similar topography as the metallized slug and prevent the lateral displacement of the metallized slug. For instance, the alignment guide can be aligned along and conform to four sides, two diagonal corners or four corners of the metallized slug so as to confine the dislocation of the metallized slug laterally. Besides, the alignment guide around the attached surface of the metallized slug preferably has a height in a range of 5-200 microns.

The first routing circuitry and the second routing circuitry are formed on the top surfaces of the isolator and the resin laminate, respectively, before the step of attaching the isolator to the resin laminate. Preferably, the first routing circuitry includes bond pads for chip attachment and contact pads for bridging element connection, whereas the second routing circuitry includes terminal pads for bridging element connection and interconnect pads for external connection. The bond pads and the contact pads can be simultaneously formed on the isolator by metal patterning process, and are electrically connected to each other and have outer surfaces substantially coplanar with each other. Likewise, the terminal pads and the interconnect pads can be simultaneously formed on the resin laminate by metal patterning process, and are electrically connected to each other and have outer surfaces substantially coplanar with each other. The terminal pads and the interconnect pads on the resin laminate each have peripheral edges spaced apart from those of the contact pads and the bond pads on the isolator. As a result, the second routing circuitry on the resin laminate is electrically isolated from the first routing circuitry on the isolator when no bridging element is attached to the first and second routing circuitries.

The bridging element provides an electrical connection between the contact pads on the isolator and the terminal pads on the resin laminate. In a preferred embodiment, the first routing circuitry and the second routing circuitry are separately formed, and the bridging element is provided to serve as an unique electrical connection pathway between the first routing circuitry and the second routing circuitry. More specifically, the bridging element extends above the outer surfaces of the contact pads and the terminal pads, and spans gaps between the peripheral edges of the contact pads and the terminal pads. The example of the bridging element includes, but is not limited to, a bonding wire, a surface mounted device (SMD), a metal plate, or a soldering material. For instance, the bonding wire can be electrically coupled to the contact pad and the terminal pad by gold or copper ball bonding, or gold or aluminum wedge bonding; the SMD or metal plate can be mounted on the outer surfaces of the contact pad and the terminal pad by soldering material; or the soldering material may be mounted across the space between the contact pads and the terminal pads and in contact with the contact pads and the terminal pads.

The present invention also provides a semiconductor assembly in which a semiconductor device such as chip is mounted over the isolator of the aforementioned wiring board and electrically connected to the first routing circuitry. For instance, the semiconductor device can be flip-chip coupled to the wiring board using various using a wide variety of connection media including gold or solder bumps on the bond pads of the wiring board. As a result, the semiconductor device disposed over the isolator can be electrically connected to the interconnect pads on the resin laminate around the isolator through the bridging elements in contact with the contact pads and the terminal pads. The isolator incorporated in the wiring board can provide CTE-matched contact interface for the semiconductor device, and the heat generated by the semiconductor device can be transferred to the isolator and further spread out.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips. The chip can be a packaged or unpackaged chip. Furthermore, the chip can be a bare chip, or a wafer level packaged die, etc.

The term "cover" refers to incomplete or complete coverage in a vertical and/or lateral direction. For instance, in the position that the outer surfaces of the first and second routing circuitries face the upward direction, the optional thermal base covers the isolator, the adhesive and the binding film in the downward direction regardless of whether another element such as the dielectric layer is between the isolator and the thermal base, between the adhesive and the thermal base, and between the binding film and the thermal base.

The phrases "mounted on" and "attached on" include contact and non-contact with a single or multiple support element(s). For instance, the metallized slug can be attached on the bottom sheet regardless of whether it contacts the bottom sheet or separated from the bottom sheet by a thermally conductive adhesive.

The phrase "aligned with" refers to relative position between elements regardless of whether elements are spaced from or adjacent to one another or one element is inserted into and extends into the other element. For instance, the alignment guide is laterally aligned with the metallized slug since an imaginary horizontal line intersects the alignment guide and the metallized slug, regardless of whether another element is between the alignment guide and the metallized slug and is intersected by the line, and regardless of whether another imaginary horizontal line intersects the metallized slug but not the alignment guide or intersects the alignment guide but not the metallized slug. Likewise, the metallized vias of the optional thermal base are aligned with the metallized slug.

The phrase "in close proximity to" refers to a gap between elements not being wider than the maximum acceptable limit. As known in the art, when the gap between the metallized slug and the alignment guide is not narrow enough, the metallized slug may not be accurately confined at a predetermined location. The maximum acceptable limit for a gap between the metallized slug and the alignment guide can be determined depending on how accurately it is desired to dispose the metallized slug at the predetermined location. Thereby, the description "the alignment guide is in close proximity to peripheral edges of the metallized slug" means that the gap between the peripheral edges of the metallized slug and the alignment guide is narrow enough to prevent the location error of the metallized slug from exceeding the maximum acceptable error limit. For instance, the gaps in between the metallized slug and the alignment guide may be in a range of about 25 to 100 microns.

The phrases "electrical connection", "electrically connected" and "electrically coupled" refer to direct and indirect electrical connection. For instance, the first routing circuitry is electrically connected to the second routing circuitry by the bridging elements but does not contact the second routing circuitry.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A wiring board having an isolator and a bridging element, comprising:
   a resin laminate having a planar top surface, a planar bottom surface and an aperture, wherein the aperture has interior sidewalls extending through the resin laminate between the top surface and the bottom surface thereof;
   an isolator having a planar top surface and a planar bottom surface and disposed in the aperture of the resin laminate, the isolator being thermally conductive with a coefficient of thermal expansion of 10 ppm/K or less, wherein peripheral edges of the isolator are attached to the interior sidewalls of the resin laminate by an adhesive;

a first routing circuitry disposed on the top surface of the isolator and a second routing circuitry disposed on the top surface of the resin laminate, wherein the first routing circuitry and the second routing circuitry are spaced apart from each other; and a bridging element that is attached to the first routing circuitry at one end and to the second routing circuitry at another end to electrically connect the first routing circuitry and the second routing circuitry, wherein no portion of the bridging element is directly attached to the top surface of the isolator, the top surface of the resin laminate or the adhesive between the isolator and the resin laminate.

2. The wiring board of claim 1, wherein the bridging element is a bonding wire that includes gold or copper ball bonding, or gold or aluminum wedge bonding.

3. The wiring board of claim 1, wherein the bridging element is a surface mounted device or a metal plate, and the bridging element is attached to the first and second routing circuitries by a soldering material.

4. The wiring board of claim 1, wherein the bridging element is a soldering material that contacts the first routing circuitry and the second routing circuitry directly.

5. The wiring board of claim 1, wherein the isolator includes a ceramic, a glass or an insulated semiconductor.

6. A semiconductor assembly, comprising:

the wiring board of claim 1; and a semiconductor device that is mounted over the isolator and electrically connected to the first routing circuitry.

7. The semiconductor assembly of claim 6, wherein the bridging element includes a bonding wire, a surface mounted device, a metal plate, or a soldering material.

* * * * *